US012593666B2

(12) United States Patent
Sampath Kumar et al.

(10) Patent No.: US 12,593,666 B2
(45) Date of Patent: *Mar. 31, 2026

(54) METHODS, SYSTEMS, AND APPARATUS FOR CONDUCTING A RADICAL TREATMENT OPERATION PRIOR TO CONDUCTING AN ANNEALING OPERATION

(71) Applicant: Applied Materials, Inc., Santa Clara, CA (US)

(72) Inventors: Pradeep Sampath Kumar, San Jose, CA (US); Norman L. Tam, Cupertino, CA (US); Dongming Iu, Union City, CA (US); Shashank Sharma, Fremont, CA (US); Eric R. Rieske, Livermore, CA (US); Michael P. Kamp, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/437,058

(22) Filed: Feb. 8, 2024

(65) Prior Publication Data

US 2024/0178004 A1 May 30, 2024

Related U.S. Application Data

(62) Division of application No. 17/569,238, filed on Jan. 5, 2022, now Pat. No. 11,901,195.

(Continued)

(51) Int. Cl.
| | |
|---|---|
| *H01L 21/324* | (2006.01) |
| *H01L 21/321* | (2006.01) |
| *H01L 21/67* | (2006.01) |

(52) U.S. Cl.
CPC .......... *H01L 21/324* (2013.01); *H01L 21/321* (2013.01); *H01L 21/67098* (2013.01); *H01L 21/67201* (2013.01)

(58) Field of Classification Search
None
See application file for complete search history.

(56) References Cited

U.S. PATENT DOCUMENTS

| | | | |
|---|---|---|---|
| 5,306,662 | A | 4/1994 | Nakamura et al. |
| 9,570,345 | B1 | 2/2017 | Bekiaris et al. |

(Continued)

OTHER PUBLICATIONS

International Search Report and Written Opinion dated Dec. 1, 2022 for Application No. PCT/US2022/041151.

(Continued)

*Primary Examiner* — Jack S Chen
(74) *Attorney, Agent, or Firm* — Patterson + Sheridan, LLP

(57) ABSTRACT

Aspects of the present disclosure relate to methods, systems, and apparatus for conducting a radical treatment operation on a substrate prior to conducting an annealing operation on the substrate. In one implementation, a method of processing semiconductor substrates includes pre-heating a substrate, and exposing the substrate to species radicals. The exposing of the substrate to the species radicals includes a treatment temperature that is less than 300 degrees Celsius, a treatment pressure that is less than 1.0 Torr, and a treatment time that is within a range of 8.0 minutes to 12.0 minutes. The method includes annealing the substrate after the exposing of the substrate to the species radicals. The annealing includes exposing the substrate to molecules, an anneal temperature that is 300 degrees Celsius or greater, an anneal pressure that is within a range of 500 Torr to 550 Torr, and an anneal time that is less than 4.0 minutes.

14 Claims, 7 Drawing Sheets

Related U.S. Application Data

(60) Provisional application No. 63/271,000, filed on Oct. 22, 2021.

(56) References Cited

U.S. PATENT DOCUMENTS

| | | | |
|---|---|---|---|
| 11,901,195 B2 * | 2/2024 | Sampath Kumar | ......................... H01L 21/67103 |
| 2002/0098710 A1 | 7/2002 | Sandhu et al. | |
| 2005/0130448 A1 | 6/2005 | Olsen et al. | |
| 2009/0104789 A1 | 4/2009 | Mallick et al. | |
| 2009/0117736 A1 | 5/2009 | Mebarki et al. | |
| 2017/0162369 A1 | 6/2017 | Kang et al. | |
| 2017/0316930 A1 | 11/2017 | Pan et al. | |
| 2023/0128128 A1 | 4/2023 | Sampath Kumar et al. | |

OTHER PUBLICATIONS

Office Action in a related application KR 10-2025-7022842 dated Nov. 29, 2025.

* cited by examiner

400

TRANSFER A SUBSTRATE FROM A LOAD
LOCK CHAMBER TO A FIRST CHAMBER
402

PRE-HEAT THE SUBSTRATE
403a

PURGE PRE-HEAT MOLECULES
403b

EXPOSE THE SUBSTRATE TO
SPECIES RADICALS
404

TRANSFER THE SUBSTRATE FROM THE
FIRST CHAMBER AND TO A SECOND
CHAMBER THROUGH A TRANSFER CHAMBER
406

ANNEAL THE SUBSTRATE
408

500

| Operation Parameters | Exposing Species Radicals in First Chamber | Annealing in Second Chamber | Transfer Period(s) for First Chamber | Transfer Period(s) for Second Chamber | First Buffer Period(s) for First Chamber | Second Buffer Period(s) for Second Chamber | Air Break Period |
|---|---|---|---|---|---|---|---|
| Implementation 1 | - | Anneal substrate to 300 degrees Celsius in 2 minutes | - | Supply $N_2$ to second chamber at 530 Torr and 15 LPM | - | Supply $N_2$ to second chamber at 530 Torr and 45 LPM | - |
| Implementation 2 | (1) Pre-heat chamber with $H_2$<br>(2) Purge radical supply lines with $H_2$ at 18 Torr<br>(3) Expose substrate to species radicals at 200 degrees Celsius for 10 minutes | - | Supply Argon to first chamber at 18 Torr and 3 LPM | - | Supply $N_2$ to first chamber at 18 Torr and 3 LPM | - | - |
| Implementation 3 | (1) Pre-heat chamber with $H_2$<br>(2) Purge radical supply lines with $H_2$ at 18 Torr<br>(3) Expose substrate to species radicals at 200 degrees Celsius for 10 minutes | Anneal substrate to 300 degrees Celsius in 2 minutes | Supply Argon to first chamber at 18 Torr and 3 LPM | Supply $N_2$ to second chamber at 530 Torr and 15 LPM | Supply $N_2$ to first chamber at 18 Torr and 3 LPM | Supply $N_2$ to second chamber at 530 Torr and 45 LPM | Yes, 60 minutes |
| Implementation 4 | (1) Pre-heat chamber with $H_2$<br>(2) Purge radical supply lines with $H_2$ at 530 Torr<br>(3) Expose substrate to species radicals at 200 degrees Celsius for 10 minutes | - | Supply Argon to first chamber at 530 Torr and 11 LPM | - | Supply $N_2$ to first chamber at 530 Torr and 45 LPM | - | - |

FIG. 5A

500

| | | | | | | | |
|---|---|---|---|---|---|---|---|
| Implementation 5 | (1) Pre-heat chamber with H₂ (2) Purge radical supply lines with H₂ at 530 Torr (3) Expose substrate to species radicals at 200 degrees Celsius for 10 minutes | Anneal substrate to 300 degrees Celsius in 2 minutes | Supply Argon to first chamber at 530 Torr and 11 LPM | Supply N₂ to second chamber at 530 Torr and 15 LPM | Supply N₂ to first chamber at 530 Torr and 45 LPM | Supply N₂ to second chamber at 530 Torr and 45 LPM | In-situ |
| Implementation 6 | (1) Pre-heat chamber with H₂ (2) Purge radical supply lines with H₂ at 530 Torr (3) Expose substrate to species radicals at 200 degrees Celsius for 10 minutes | - | Supply Argon to first chamber at 530 Torr and 25 LPM | - | Supply N₂ to first chamber at 530 Torr and 45 LPM | - | - |
| Implementation 7 | (1) Pre-heat chamber with H₂ (2) Purge radical supply lines with H₂ at 530 Torr (3) Expose substrate to species radicals at 200 degrees Celsius for 10 minutes | Anneal substrate to 300 degrees Celsius in 2 minutes | Supply Argon to first chamber at 530 Torr and 25 LPM | Supply N₂ to second chamber at 530 Torr and 15 LPM | Supply N₂ to first chamber at 530 Torr and 50 LPM | Supply N₂ to second chamber at 530 Torr and 50 LPM | In-situ |

FIG. 5B

METHODS, SYSTEMS, AND APPARATUS FOR CONDUCTING A RADICAL TREATMENT OPERATION PRIOR TO CONDUCTING AN ANNEALING OPERATION

CROSS-REFERENCE TO RELATED APPLICATIONS

This application is a divisional of U.S. patent application Ser. No. 17/569,238, filed Jan. 5, 2022. application Ser. No. 17/569,238 claims benefit of U.S. Provisional application No. 63/271,000, filed Oct. 22, 2021. Both application Ser. No. 17/569,238 and U.S. Provisional application No. 63/271,000 are incorporated herein by reference in their entireties.

BACKGROUND

Field

Aspects of the present disclosure relate to methods, systems, and apparatus for conducting a radical treatment operation on a substrate prior to conducting an annealing operation on the substrate. In one aspect, the radical treatment operation is conducted in a first chamber and the annealing operation is conducted in a second chamber that is coupled to the same mainframe of the same cluster tool as the first chamber.

Description of the Related Art

Substrates for semiconductor operations can be limited in operation. For example, substrates can have high sheet resistances and limited gap fill. As another example, substrates can have low grain sizes. Such limitations can be especially pervasive at the back end of line (BEOL) for the substrates.

Therefore, there is a need for improved methods, systems, and apparatus that facilitate lower sheet resistances, improved gap fills, and increased grain sizes for substrates.

SUMMARY

Aspects of the present disclosure relate to methods, systems, and apparatus for conducting a radical treatment operation on a substrate prior to conducting an annealing operation on the substrate. In one aspect, the radical treatment operation is conducted in a first chamber and the annealing operation is conducted in a second chamber that is coupled to the same mainframe of the same cluster tool as the first chamber.

In one implementation, a method of processing semiconductor substrates includes pre-heating a substrate, and exposing the substrate to species radicals. The exposing of the substrate to the species radicals includes a treatment temperature that is less than 350 degrees Celsius, a treatment pressure that is less than 1.0 Torr, and a treatment time that is within a range of 2.0 minutes to 12.0 minutes. The method includes annealing the substrate after the exposing of the substrate to the species radicals. The annealing includes exposing the substrate to molecules, an anneal temperature that is 300 degrees Celsius or greater, an anneal pressure that is within a range of 500 Torr to 550 Torr, and an anneal time that is less than 4.0 minutes.

In one implementation, a non-transitory computer readable medium includes instructions that, when executed by a processor, cause a plurality of operations to be conducted. The plurality of operations include pre-heating a substrate, and exposing the substrate to species radicals. The exposing of the substrate to the species radicals includes a treatment temperature that is less than 300 degrees Celsius, a treatment pressure that is less than 1.0 Torr, and a treatment time that is within a range of 8.0 minutes to 12.0 minutes. The method includes annealing the substrate after the exposing of the substrate to the species radicals. The annealing includes exposing the substrate to molecules, an anneal temperature that is 300 degrees Celsius or greater, an anneal pressure that is within a range of 500 Torr to 550 Torr, and an anneal time that is less than 4.0 minutes.

In one implementation, a system for processing substrates includes a cluster tool that includes a mainframe. The system includes a first chamber coupled to the mainframe, the first chamber having a first process volume, and a second chamber coupled to the mainframe, the second chamber having a second process volume. The system includes a controller having a processor and a memory having instructions that, when executed by the processor, cause a plurality of operations to be conducted. The plurality of operations include pre-heating a substrate, and exposing the substrate to species radicals. The exposing of the substrate to the species radicals includes a treatment temperature that is less than 300 degrees Celsius, a treatment pressure that is 0.4 Torr, and a treatment time that is within a range of 8.0 minutes to 12.0 minutes. The plurality of operations include annealing the substrate after the exposing of the substrate to the species radicals. The annealing includes exposing the substrate to molecules, an anneal temperature that is 300-400 degrees Celsius, an anneal pressure that is 530 Torr, and an anneal time that is less than 4.0 minutes.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

FIG. 5A is a schematic table view of a table having operation parameters for various implementations according to the present disclosure.

FIG. 5B is a schematic table view of a portion of the table having operation parameters for various implementations according to the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Aspects of the present disclosure relate to methods, systems, and apparatus for conducting a radical treatment operation on a substrate prior to conducting an annealing operation on the substrate. In one aspect, the radical treatment operation is conducted in a first chamber and the annealing operation is conducted in a second chamber that is coupled to the same mainframe of the same cluster tool as the first chamber.

Figure 1:
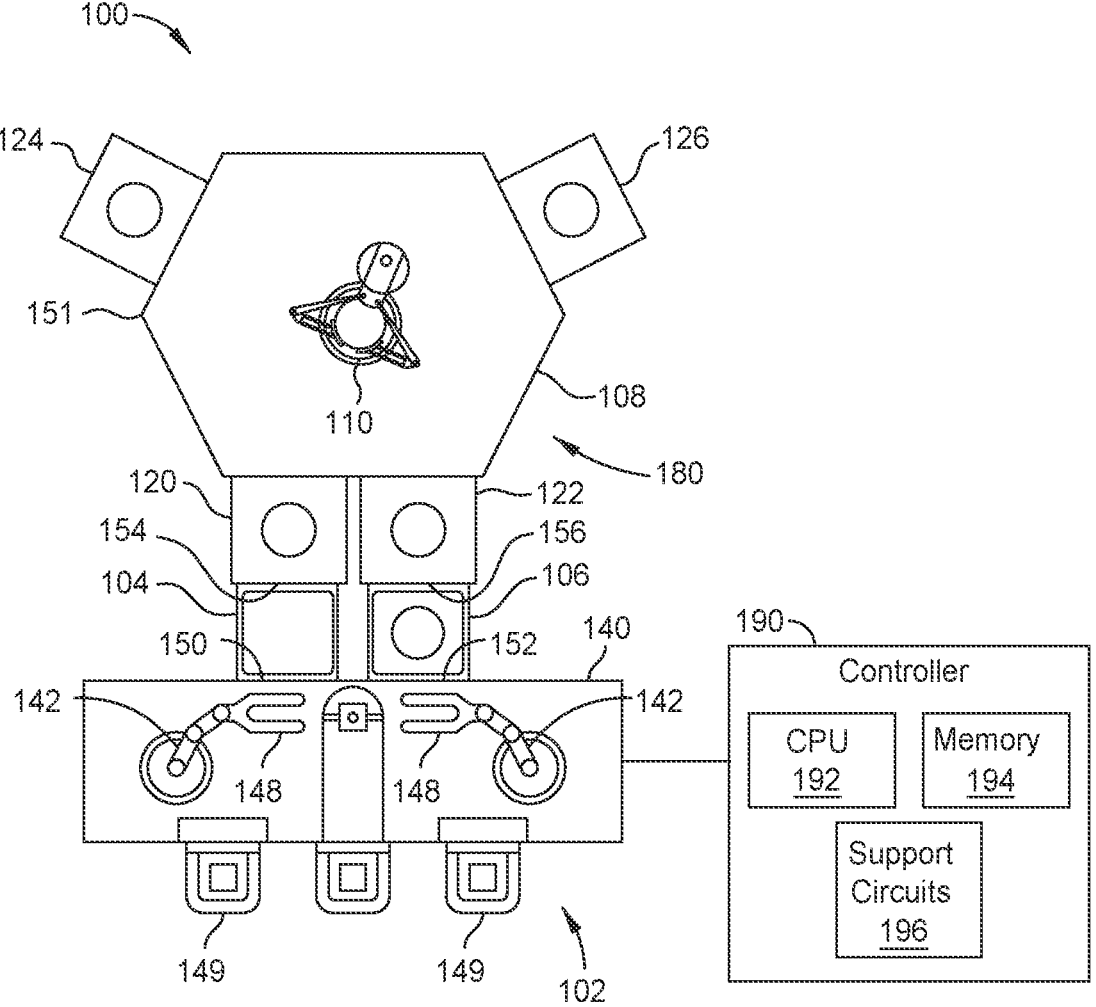
FIG. 1 is a schematic top-view diagram of a system for processing substrates, according to one implementation.

FIG. 1 is a schematic top-view diagram of a system 100 for processing substrates, according to one implementation. The system 100 includes a cluster tool 180. The cluster tool 180 includes a factory interface 102, one or more transfer chambers 108 (one is shown) with a transfer robot 110 disposed therein. The cluster tool 180 includes one or more first chambers 120, 122 (two are shown) and one or more second chambers 124, 126 (two are shown) mounted to a mainframe 151 of the single cluster tool 180. The one or more first chambers 120, 122 are radical treatment chambers that are each configured to conduct a radical treatment operation on substrates. The one or more second chambers 124, 126 are anneal chambers that are each configured to conduct an annealing operation on substrates.

As detailed herein, substrates in the system 100 can be processed in and transferred between the various chambers without being exposed to an ambient environment exterior to the cluster tool 180. For example, substrates can be processed in and transferred between the various chambers in a low pressure (e.g., 550 Torr or less) or vacuum environment (e.g., 20 Torr or less) without breaking the low pressure or vacuum environment between various processes performed on the substrates in the system 100. In one embodiment, which can be combined with other embodiments, the system 100 provides an integrated cluster tool 180 for conducting processing operations on substrates.

In the implementation shown in FIG. 1, the factory interface 102 includes a docking station 140 and factory interface robots 142 to facilitate transfer of substrates. The docking station 140 is configured to accept one or more front opening unified pods (FOUPs) 149. In one embodiment, which can be combined with other embodiments, each factory interface robot 142 includes a blade 148 disposed on one end of the respective factory interface robot 142 configured to transfer substrates from the factory interface 102 to the load lock chambers 104, 106.

The load lock chambers 104, 106 have respective doors 150, 152 interfacing with the factory interface 102 and respective doors 154, 156 interfacing with the one or more first chambers 120, 122. The one or more first chambers 120, 122 have respective doors interfacing with the transfer chamber 108, and the one or more second chambers 124, 126 have respective doors interfacing with the transfer chamber 108.

The doors can include, for example, slit openings with slit valves for passing substrates therethrough by the transfer robot 110 and for providing a seal between respective chambers to prevent a gas from passing between the respective chambers. A door can be open for transferring a substrate therethrough, and otherwise closed.

The load lock chambers 104, 106, the transfer chamber 108, the first chambers 120, 122, and the second chambers 124, 126 may be fluidly coupled to a gas and pressure control system. The gas and pressure control system can include one or more gas pumps (e.g., turbo pumps, cryopumps, roughing pumps, vacuum pumps, etc.), gas sources, various valves, and conduits fluidly coupled to the various chambers.

The system 100 includes a controller 190 configured to control the system 100 or components thereof. For example, the controller 190 may control the operation of the system 100 using a direct control of the chambers 104, 106, 108, 120, 122, 124, 126 of the system 100 or by controlling controllers associated with the chambers 104, 106, 108, 120, 122, 124, 126. The controller 190 is configured to control the gas and pressure control system. In operation, the controller 190 enables data collection and feedback from the respective chambers and the gas and pressure control system to coordinate and control performance of the system 100.

The controller 190 generally includes a central processing unit (CPU) 192, a memory 194, and support circuits 196. The CPU 192 may be one of any form of a general purpose processor that can be used in an industrial setting. The memory 194, or non-transitory computer readable medium, is accessible by the CPU 192 and may be one or more of memory such as random access memory (RAM), read only memory (ROM), floppy disk, hard disk, or any other form of digital storage, local or remote. The support circuits 196 are coupled to the CPU 192 and may include cache, clock circuits, input/output subsystems, power supplies, and the like.

The various methods (such as the method 400) and operations disclosed herein may generally be implemented under the control of the CPU 192 by the CPU 192 executing computer instruction code stored in the memory 194 (or in memory of a particular processing chamber) as, e.g., a software routine. When the computer instruction code is executed by the CPU 192, the CPU 192 controls the chambers to conduct processes in accordance with the various methods and operations described herein. In one embodiment, which can be combined with other embodiments, the memory 194 includes instructions stored therein that, when executed, cause the methods (such as the method 400) and operations (such as the operations 402, 403*a*, 403*b*, 404, 406, 408) described herein to be conducted.

Other processing systems in other configurations are contemplated. For example, more or fewer processing chambers may be coupled to a transfer apparatus. In the implementation shown in FIG. 1, the transfer apparatus includes the transfer chamber 108. In other implementations, more or fewer transfer chambers (e.g., one transfer chamber) may be implemented as a transfer apparatus in a system for processing substrates.

Figure 2A:
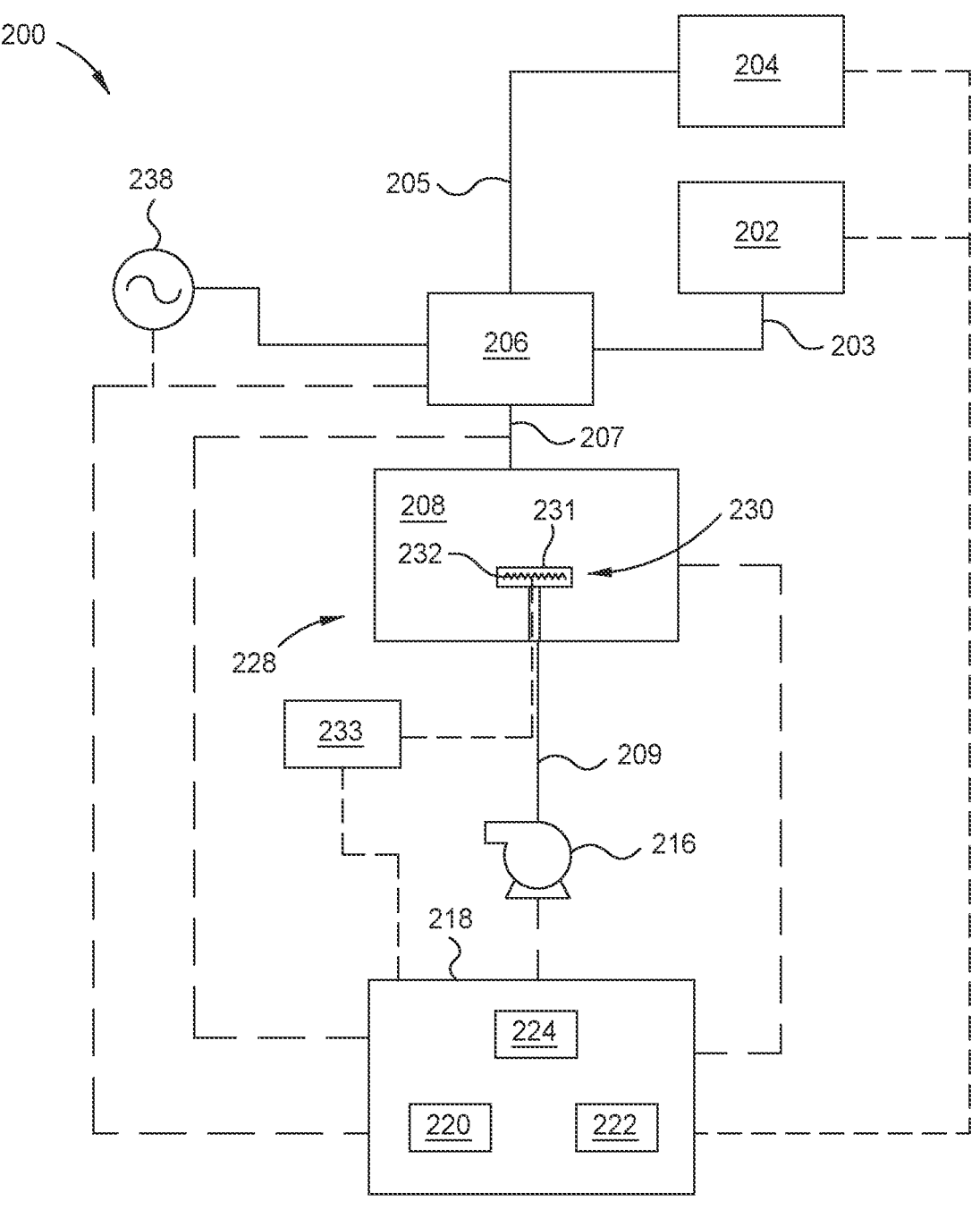
FIG. 2A is a schematic partial view of a system for thermally annealing substrates, according to one implementation.

FIG. 2A is a schematic partial view of a system 200 for thermally annealing substrates, according to one implementation. The system 200 includes a process chamber 228, such as the PYRA® chamber available from Applied Materials, Inc. of Santa Clara, Calif.

The system 200 can be used as at least part of each of the one or more second chambers 124, 126 shown in FIG. 1 that are configured to conduct the annealing operation.

The system 200 also includes a remote plasma source (RPS) 206, and a gas line 207 coupling the remote plasma source 206 to the process chamber 228. The present disclosure contemplates that in an in-situ plasma operation may be used in place of the RPS 206. The process chamber 228 can be used as at least part of each of the one or more second chambers 124, 126 shown in FIG. 1. The process chamber 228 can be a heater based process chamber, or a rapid thermal processing (RTP) chamber, such as a rapid thermal anneal (RTA) chamber. The process chamber 228 can be any thermal processing chamber where delivery of at least one metastable radical molecular species and/or radical atomic species to a processing volume can be used. The process chamber 228 includes a pedestal heater 230. The pedestal heater 230 includes a base platform that includes a support surface 231. The support surface 231 is circular or rectangular in shape. The pedestal heater 230 includes one or more heater elements 232 embedded in the pedestal heater 230. The one or more heater elements 232 include one or more resistive heater elements, such as wire mesh(es) and/or resistive heating coil(s). The pedestal heater 230 includes a ceramic or aluminum body with the one or more heater elements 232 embedded in the ceramic or aluminum body. The one or more heater elements 232 are connected to a power source 233 that supplies power, such as electrical power (for example direct current or alternating current), to the one or more heater elements 232. The one or more heater elements 232 and the pedestal heater 230 are used to heat and control a temperature of a substrate (disposed on the pedestal heater 230) and a film stack of the substrate.

The RPS 206 is coupled to a power source 238. The power source 238 is used as an excitation source to ignite and maintain a plasma in the RPS 206. In one embodiment, which can be combined with other embodiments, the RPS 206 includes an inductively coupled plasma (ICP) source, a transformer coupled plasma (TCP) source, and/or a capacitively coupled plasma (CCP) source. In one embodiment, which can be combined with other embodiments, the power source 238 is a radio frequency (RF) source. In one example, which can be combined with other examples, the RF source delivers power between about 5 KW to about 9 KW, such as about 7 kW. In one embodiment, which can be combined with other embodiments, the RPS 206 includes one or more microwave resonators.

The RPS 206 is coupled to a first gas source 202 via a first gas conduit 203 and a second gas source 204 via a second gas conduit 205. The first gas source 202 supplies a first gas that includes one or more of hydrogen, oxygen, argon, and/or nitrogen. The flow rate of the first gas into the processing volume 208 is within a range of about 10 sccm to about 100,000 sccm. In one embodiment, which can be combined with other embodiments, nitrogen is supplied at a flow rate within a range of 10 sccm to 50,000 sccm, oxygen is supplied at a flow rate within a range of 10 sccm to 30,000 sccm, hydrogen is supplied at a flow rate within a range of 10 sccm to 50,000 sccm, and/or argon is supplied at a flow rate within a range of 10 sccm to 50,000 sccm.

The second gas source 204 supplies a second gas, such as oxygen gas. Oxygen plasma is formed using the RPS 206 by introducing about 1 sccm to about 50,000 sccm of oxygen gas, such as about 10 sccm to 50,000 sccm of oxygen gas introduced to the processing volume 208.

A vacuum pump 216 is used to maintain a gas pressure in the processing volume 208. The vacuum pump 216 evacuates post-processing gases and/or by-products of the process via an exhaust 209.

Figure 2B:
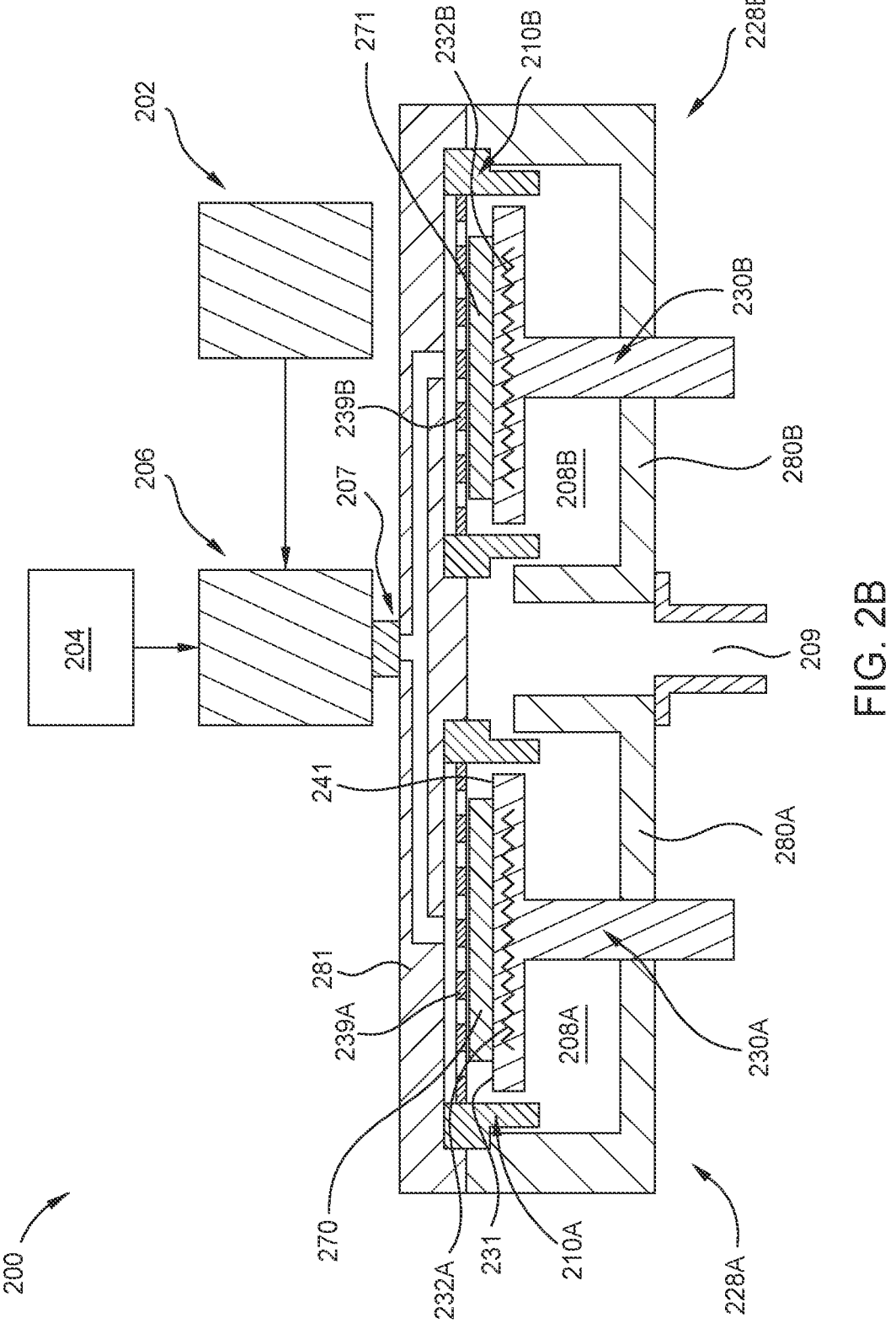
FIG. 2B is a schematic view of the system shown in FIG. 2A in a twin chamber configuration, according to one implementation.

Alternatively, the process chamber 228 can be employed in a twin chamber configuration as shown in FIG. 2B. FIG. 2B is a schematic view of the system 200 shown in FIG. 2A in a twin chamber configuration, according to one implementation. The twin chamber configuration may be used as at least part of each of the one or more second chambers 124, 126. The twin chamber configuration includes two respective processing regions 228A, 228B that are in fluid communication with each other. Each processing region 228A, 228B can be configured to include one or more of the components, features, aspects, and/or properties of the process chamber 228 shown in FIG. 2A.

Each of the processing regions 228A, 228B includes a respective lower chamber body 280A, 280B. The present disclosure contemplates that the processing regions 228A, 228B can share the same lower chamber body. The processing regions 228A, 228B share the same upper chamber body 281. The present disclosure contemplates that the processing regions 228A, 228B can each respectively include a distinct upper chamber body.

Each of the processing regions 228A, 228B includes: respective pedestal heaters 230A, 230B similar to the pedestal heater 230; respective one or more heater elements 232A, 232B similar to the one or more heater elements 232; and/or respective processing volumes 208A, 208B similar to the processing volume 208. The processing regions 228A, 228B share a single RPS 206 that provides the first gas (during a thermal anneal operation) and optionally the oxygen plasma (during an optional later clean operation to clean the processing regions 228A, 228B) to the processing volumes 208A, 208B. The RPS 206 is coupled to the first gas source 202 and the second gas source 204. Each of the processing regions 228A, 228B includes a respective process kit 210A, 210B. Each respective process kit 210A, 210B includes one or more components inside the respective one of the processing regions 228A, 228B used for on-substrate performance, such as liners. The liners can be made from quartz, ceramic, or metal. The processing regions 228A, 228B are coupled to share a single controller (such as the controller 190), or can be coupled to separate controllers. The present disclosure contemplates that portions of the process kits 210A, 210B may move and/or include flow openings to allow the first gas and the oxygen plasma to flow to the exhaust 209. The system 200 can include a valve, disposed for example along the exhaust 209, such that the first gas and the oxygen plasma are not exhausted and are instead directed to the processing volumes 208A, 208B during the thermal anneal operation and the optional later clean operation. Each of the processing regions 228A, 228B includes respective gas distribution plates 239A, 239B.

A first substrate 270 and a second substrate 271 are directly supported respectively on the pedestal heaters 230A, 230B to undergo a thermal anneal operation.

Figure 3:
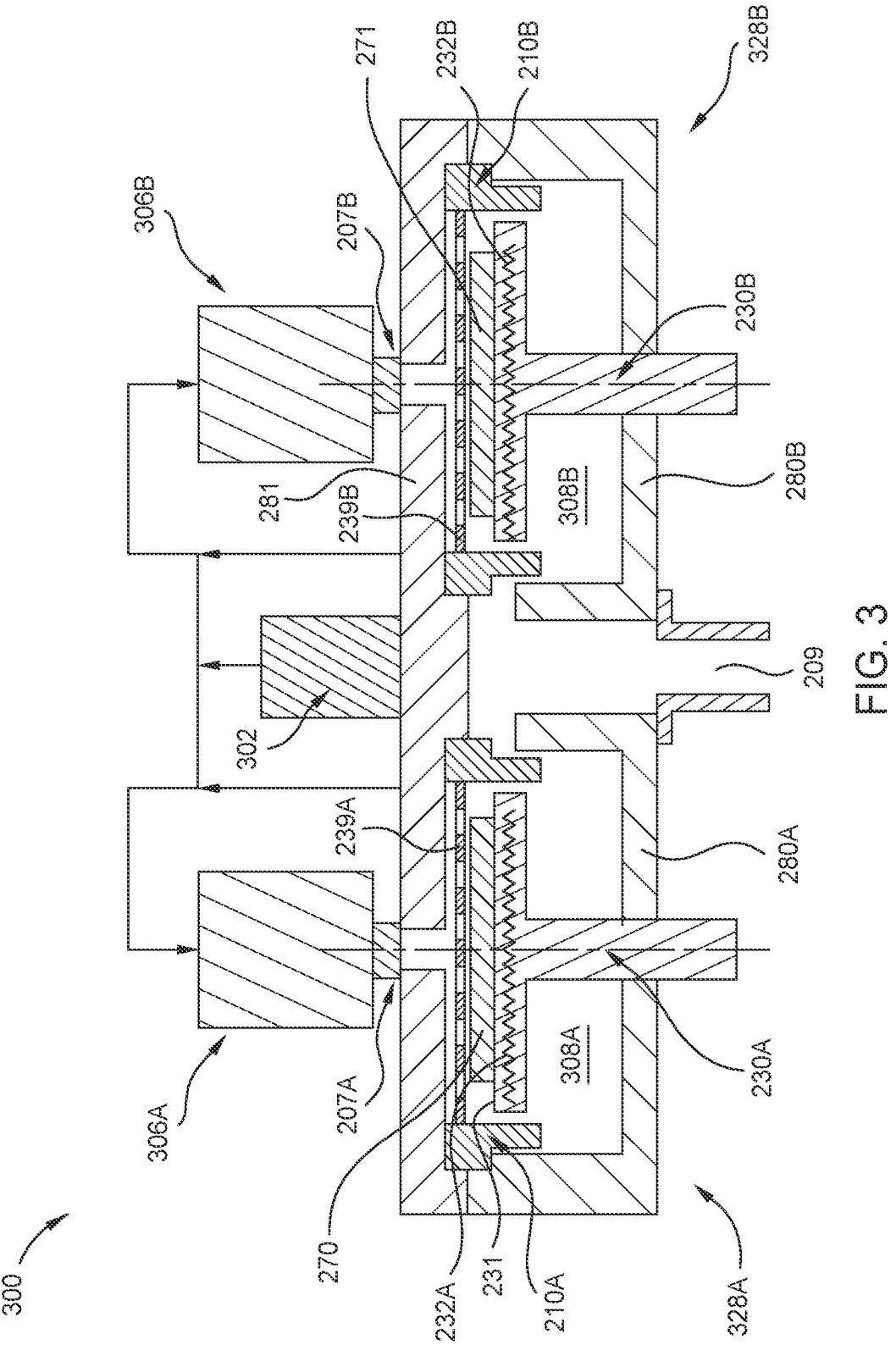
FIG. 3 is a schematic partial view of a system for processing substrates, according to one implementation.

FIG. 3 is a schematic partial view of a system 300 for processing substrates, according to one implementation. The system 300 is similar to the system 200 shown in FIGS. 2A-2B, and includes one or more of the aspects, features, components, and/or properties thereof. The system 300 can be used as at least part of the one or more first process chambers 120, 122 shown in FIG. 1 that are configured to conduct radical treatment operations. The system 300 includes a process chamber having two respective processing regions 328A, 328B. The processing regions 328A, 328B are similar to the processing regions 228A, 228B, and include one or more—but not all—of the aspects, features, components, and/or properties thereof.

Each of the processing regions 328A, 328B includes: respective pedestal heaters 230A, 230B similar to the pedestal heater 230; respective remote plasma sources 306A, 306B similar to the RPS 206; respective gas lines 207A, 207B similar to the gas line 207; respective one or more heater elements 232A, 232B similar to the one or more heater elements 232; and/or respective processing volumes 308A, 308B similar to the processing volume 208. In one embodiment, which can be combined with other embodiments, the processing regions 328A, 328B can share a single RPS.

The system 300 includes a first gas source 302 similar to the first gas source 202 described above, and can include one or more of the aspects, features, components, and/or properties thereof. In one embodiment, which can be combined with other embodiments, each respective RPS 306A, 306B is coupled to share a single first gas source 302. In one embodiment, which can be combined with other embodiments, each RPS 306A, 306B can be coupled to a distinct first gas source. The first gas source 302 supplies one or more gases that include hydrogen, oxygen, and/or argon, such as pure hydrogen or a combination of a first gas flow of argon and a second gas flow of hydrogen or oxygen at any flow rate ratio of hydrogen or oxygen to argon, such as a flow rate ratio of hydrogen/oxygen:argon that is within a range of 1:350 to 150:1. In one embodiment, which can be combined with other embodiments, the first gas flow flows argon at a flow rate within a range of 10 sccm to 3,500 sccm to ignite plasma, and then the second gas flow flows hydrogen or oxygen at a flow rate within a range of 10 sccm to 1,500 sccm to provide hydrogen plasma or oxygen plasma.

Each RPS 306A, 306B generates hydrogen radicals using the gas, and supplies the hydrogen radicals to the respective second processing volumes 308A, 308B and to the first substrate 270 and the second substrate 271 during a radical treatment operation to clean the first and second substrates 270, 271 and reduce or remove the contaminant particles 277 from the film stacks 272 and the first and second substrates 270, 271. The present disclosure contemplates that the second substrate 271 can include film stacks similar to the film stacks 272 of the first substrate 270. The system 300 can include one or more ion filters that filter out ions from the plasma generated using the RPSs 306A, 306B.

Figure 4:
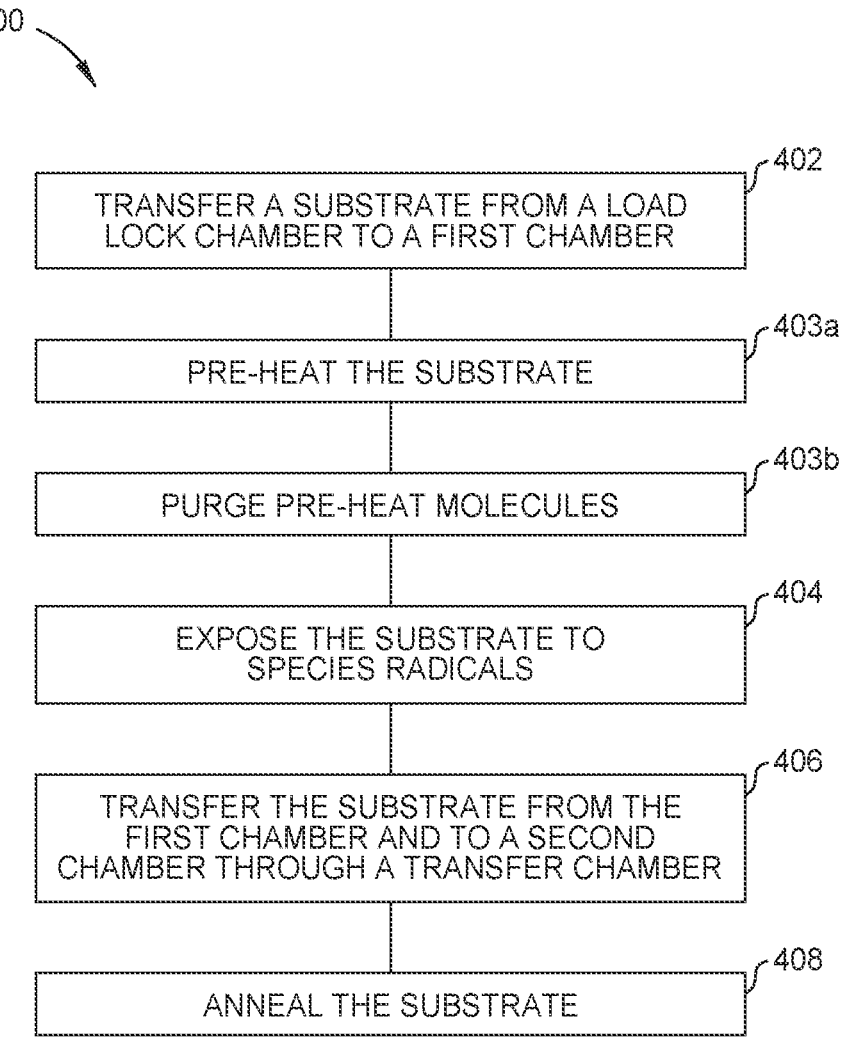
FIG. 4 is a schematic block diagram view of a method of processing semiconductor substrates, according to one implementation.

FIG. 4 is a schematic block diagram view of a method 400 of processing semiconductor substrates, according to one implementation.

A substrate is positioned in a load lock chamber. Operation 402 includes transferring the substrate from the load lock chamber and to a first process volume of a first chamber.

Operation 403*a* includes pre-heating the substrate. The pre-heating of the substrate includes exposing the substrate to pre-heat hydrogen molecules.

Operation 403*b* includes purging the pre-heat hydrogen molecules at a purge pressure. In one embodiment, which can be combined with other embodiments, the purge pressure is within a range of 15 Torr to 530 Torr, such 15 Torr to 20 Torr. In one example, a purge gas including hydrogen may be utilized at a purge pressure of 15 Torr to 20 Torr. In another example, a purge gas including argon may be utilized at a pressure within a range of 15 Torr to about 530 Torr. In one embodiment, which can be combined with other embodiments, the purge pressure is 18 Torr. In one embodiment, which can be combined with other embodiments, the purge pressure is within a range of 500 Torr to 550 Torr. In one embodiment, which can be combined with other embodiments, the purge pressure is 530 Torr.

Operation 404 includes exposing the substrate to species radicals. The exposing of the substrate to the species radicals includes a treatment temperature that is less than 350 degrees Celsius, such as less than 300 degrees Celsius, a treatment pressure that is less than 1.0 Torr, and a treatment time that is within a range of 8.0 minutes to 12.0 minutes. In one embodiment, which can be combined with other embodiments, the treatment temperature is within a range of 150 degrees Celsius to 250 Celsius degrees, such as 175 degrees Celsius to 225 degrees Celsius, such as 195 degrees Celsius to 205 degrees Celsius, the treatment pressure is within a range of 0.35 Torr to 0.45 Torr, and the treatment time is within a range of 1 minute to 60 minutes, such as 2 minutes to 30 minutes, such as 2 minutes to 15 minutes, such as 2 minutes to 12 minutes, for example 9.5 minutes to 10.5 minutes. In one embodiment, which can be combined with other embodiments, the treatment pressure is 0.4 Torr. In one embodiment, which can be combined with other embodiments, the treatment temperature is 200 degrees Celsius, and the treatment time is 10 minutes.

The species radicals are supplied to the first internal volume at a flow rate within a range of 1,300 SCCM to 1,400 SCCM for a 300 mm diameter substrate. In one embodiment, which can be combined with other embodiments, the flow rate is 1,350 SCCM. In one embodiment, which can be combined with other embodiments, the species radicals include atomic hydrogen radicals. In one embodiment, which can be combined with other embodiments, the species radicals include one or more of oxygen ($O_2$), nitrogen ($N_2$), and/or helium (He).

The species radicals of operation 404 can be generated using one or more of a remote plasma source (RPS), an inductively coupled plasma (ICP) source, and/or one or more microwave resonators for in-situ generation.

Operation 406 includes transferring the substrate from the first process volume of the first chamber and to a second process volume of a second chamber through a transfer volume of a transfer chamber. The transfer volume of the transfer chamber is maintained at a transfer pressure that is within a range of 500 Torr to 550 Torr.

During the transferring of the substrate into and out of the first chamber (such as the transferring of operation 402 and/or the transferring of operation 406), argon (Ar) is supplied as a purge gas to the first process volume of the first chamber at a first transfer pressure and a first transfer flow rate. In one embodiment, which can be combined with other embodiments, the first transfer pressure is within a range of 16 Torr to 20 Torr and the first transfer flow rate is within a range of 2.5 liters per minute (LPM) to 3.5 LPM. In one embodiment, which can be combined with other embodiments, the first transfer pressure is 18 Torr and the first transfer flow rate is 3.0 LPM. In one embodiment, which can be combined with other embodiments, the first transfer pressure is within a range of 500 Torr to 550 Torr and the first transfer flow rate is within a range of 10.0 LPM to 12.0 LPM. In one embodiment, which can be combined with other embodiments, the first transfer pressure is 530 Torr and the first transfer flow rate is 11.0 LPM. In one embodiment, which can be combined with other embodiments, the first transfer pressure is within a range of 500 Torr to 550 Torr and the first transfer flow rate is within a range of 24.0 LPM to 26.0 LPM. In one embodiment, which can be combined with other embodiments, the first transfer pressure is 530 Torr and the first transfer flow rate is 25.0 LPM.

During one or more first buffer periods (such as one or more first downtime periods) for the first chamber, nitrogen ($N_2$) is supplied to the first process volume of the first chamber at a first buffer pressure and a first buffer flow rate. In one embodiment, which can be combined with other embodiments, the first buffer pressure is within a range of 15 Torr to 20 Torr and the first buffer flow rate is within a range of 2.5 LPM to 3.5 LPM. In one embodiment, which can be combined with other embodiments, the first buffer pressure is 18 Torr and the first buffer flow rate is 3.0 LPM. In one embodiment, which can be combined with other embodiments, the first buffer pressure is within a range of 500 Torr to 550 Torr and the first buffer flow rate is within a range of 40.0 LPM to 50.0 LPM. In one embodiment, which can be combined with other embodiments, the first buffer pressure is 530 Torr and the first buffer flow rate is 45.0 LPM. In one embodiment, which can be combined with other embodiments, the first buffer pressure is 530 Torr and the first buffer flow rate is 50.0 LPM.

During the transferring of the substrate into and out of the second chamber (such as the transferring of operation 406), nitrogen ($N_2$) is supplied as a purge gas to the second process volume of the second chamber at a second transfer pressure and a second transfer flow rate. In one embodiment, which can be combined with other embodiments, the second transfer pressure is within a range of 500 Torr to 550 Torr and the second transfer flow rate is within a range of 14.0 LPM to 16.0 LPM. In one embodiment, which can be combined with other embodiments, the second transfer pressure is 530 Torr and the second transfer flow rate is 15.0 LPM.

During one or more second buffer periods (such as one or more second downtime periods) for the second chamber, nitrogen ($N_2$) is supplied to the second process volume of the second chamber at a second buffer pressure and a second buffer flow rate. In one embodiment, which can be combined with other embodiments, the second buffer pressure is within a range of 500 Torr to 550 Torr and the second buffer flow rate is within a range of 40.0 LPM to 50.0 LPM. In one embodiment, which can be combined with other embodiments, the second buffer pressure is 530 Torr and the second buffer flow rate is 45.0 LPM. In one embodiment, which can be combined with other embodiments, the second buffer pressure is 530 Torr and the second buffer flow rate is 50.0 LPM.

Operation 406 can include an air break period where the substrate is exposed to ambient air prior to being transferred into the second process volume of the second chamber. In one embodiment, which can be combined with other embodiments, the air break period occurs while the substrate is positioned in-situ in the cluster tool 180. In one embodiment, which can be combined with other embodiments, the air break period is within a range of 55.0 minutes to 65.0 minutes, such as 60.0 minutes.

Operation 408 includes annealing the substrate after the exposing of the substrate to the species radicals. The annealing includes an anneal temperature that is 300 degrees Celsius or greater, such as 300 degrees Celsius to 400 degrees Celsius, an anneal pressure that is within a range of 500 Torr to 550 Torr, and an anneal time that is less than 4.0 minutes. In one embodiment, which can be combined with other embodiments, the anneal temperature is within a range of 300 degrees Celsius to 305 degrees Celsius, the anneal pressure is within a range of 525 Torr to 535 Torr, and the anneal time is within a range of 1.5 minutes to 2.5 minutes. In one embodiment, which can be combined with other embodiments, the anneal temperature is 300 degrees Celsius, and the anneal time is 2.0 minutes. In one embodiment, which can be combined with other embodiments, the anneal temperature is 350 degrees Celsius, and the anneal pressure is 530 Torr. In one embodiment, which can be combined with other embodiments, the annealing environment includes hydrogen ($H_2$). In one embodiment, which can be combined with other embodiments, the annealing environment additionally or alternatively includes one or more of hydrogen ($H_2$), dinitride ($N_2$), and/or ammonia ($NH_3$).

During the annealing of operation 408, the substrate can be heated using one or more lamp heaters and/or one or more resistive heaters that heat a pedestal on which the substrate is supported.

The present disclosure contemplates that the method 400 can be conducted after other semiconductor processing operations, such as after a deposition operation (e.g., a chemical vapor deposition (CVD) operation), an etching operation, and/or a lithography operation.

The pre-heating of the substrate (of operation 403*a*) and the exposing of the substrate to the hydrogen radicals (of operation 404) occurs in the first process volume of the first chamber, and the annealing of the substrate (of operation 408) occurs in the second process volume of the second chamber. The first chamber and the second chamber are coupled to a mainframe of a single cluster tool.

The present disclosure contemplates that the operations 402, 403*a*, 403*b*, 404, 406, 408 can be repeated on the substrate being processed. The conducting of the method 400 in one or more iterations reduces a sheet resistance of one or more metals of the substrate. In one embodiment, which can be combined with other embodiments, the one or more metals include one or more of copper (Cu), ruthenium (Ru), and/or dinitride ($N_2$).

The operation parameters described herein can be used in relation to the method 400. The operation parameters facilitate reduced sheet resistances, improved gap fills, and increased grain sizes for substrates (such as substrates having one or more metals). The operation parameters also facilitate maintaining impurity levels (such as levels of carbon, hydrogen, and oxygen impurities) within similar and acceptable levels.

As an example, the operation parameters disclosed for the treatment temperature, the treatment pressure, the treatment time, the anneal temperature, the anneal pressure, and the anneal time facilitate reduced sheet resistances, improved gap fills, and increased grain sizes while facilitating maintained impurity levels within similar and acceptable levels.

FIG. 5A is a schematic table view of a portion of a table 500 having operation parameters for various implementations according to the present disclosure.

FIG. 5B is a schematic table view of a portion of the table 500 having operation parameters for various implementations according to the present disclosure.

The table 500 shown in FIGS. 5A and 5B shows seven implementations (Implementation 1-Implementation 7) and the operation parameters used therein.

In accordance with the present disclosure, it is believed that Implementation 7 facilitates achieving the largest reduction in sheet resistance of substrates having metal(s) while maintaining impurity levels (such as levels of carbon, hydrogen, and oxygen impurities) within similar and acceptable levels.

Benefits of the present disclosure include reduced sheet resistances (such as sheet resistances of one or more metals—for example, Cu (Copper)—of substrates), improved gap fills, increased grain sizes, and maintained impurity levels within similar and acceptable levels. Such benefits can be facilitated at the back end of line (BEOL) for the substrates.

Such benefits can be achieved on a single mainframe of a single integrated cluster tool, facilitating increased efficiencies, reduced footprints, reduced costs, and increased output.

It is contemplated that one or more aspects disclosed herein may be combined. As an example, one or more aspects, features, components, and/or properties of the system 100, the cluster tool 180, the system 200, the system 300, the method 400, and/or the table 500 may be combined. Moreover, it is contemplated that one or more aspects disclosed herein may include some or all of the aforementioned benefits. As an example, one or more of the operations and/or the operation parameters described in relation to the system 100, the system 200, and/or the system 300 can be combined with the operations and/or the operation parameters described in relation to the method 400 and/or the table 500.

While the foregoing is directed to embodiments of the present disclosure, other and further embodiments of the disclosure may be devised without departing from the basic scope thereof. The present disclosure also contemplates that one or more aspects of the embodiments described herein may be substituted in for one or more of the other aspects described. The scope of the disclosure is determined by the claims that follow.

The invention claimed is:

1. A method of processing semiconductor substrates, comprising:

pre-heating a substrate;

exposing the substrate to species radicals, the exposing of the substrate to the species radicals comprising:

exposing the substrate to a treatment temperature that is less than 350 degrees Celsius; and exposing the substrate for a treatment time that is within a range of 1 minute to 60 minutes; and annealing the substrate after the exposing of the substrate to the species radicals, the annealing comprising:

exposing the substrate to molecules;

exposing the substrate to an anneal temperature that is 300 degrees Celsius or greater; and exposing the substrate for an anneal time that is less than 4.0 minutes.

2. The method of claim 1, wherein exposing of the substrate to the species radicals further comprises exposing the substrate to a treatment pressure of less than 1.0 Torr.

3. The method of claim 1, wherein annealing the substrate further comprises exposing the substrate to an anneal pressure that is in a range of 500 Torr to 550 Torr.

4. The method of claim 1, wherein the species radicals comprise atomic hydrogen radicals.

5. The method of claim 4, wherein exposing the substrate to species radicals includes flowing a mixture of hydrogen and argon.

6. The method of claim 5, wherein a flow rate ratio of hydrogen to argon is in a range of 1:350 to 150:1.

7. The method of claim 4, wherein exposing the substrate to species radicals includes flowing a mixture of hydrogen and helium.

8. The method of claim 1, wherein the molecules comprise one or more of hydrogen ($H_2$), dinitride ($N_2$), or ammonia ($NH_3$).

9. The method claim 1, wherein:

pre-heating the substrate comprises exposing the substrate to pre-heat hydrogen molecules; and the method further comprises purging the pre-heat hydrogen molecules at a purge pressure prior to exposing the substrate to the species radicals.

10. The method of claim 9, wherein the purge pressure is within a range of 15 Torr to 20 Torr.

11. The method of claim 9, wherein the purge pressure is within a range of 500 Torr to 550 Torr.

12. The method claim 1, wherein:

exposing the substrate to species radicals is conducted in a first chamber;

annealing the substrate is conducted in a second chamber; and the method further comprises:

transferring the substrate out of the first chamber and into the second chamber; and supplying a first purge gas to the first chamber during the transferring of the substrate out of the first chamber.

13. The method claim 12, further comprising supplying a second purge gas different from the first purge gas to the second chamber during the transferring of the substrate into the second chamber.

14. The method claim 13, wherein the first purge gas is argon and the second purge gas is nitrogen ($N_2$).

* * * * *